United States Patent
Jones, Jr. et al.

(10) Patent No.: US 6,625,078 B2
(45) Date of Patent: Sep. 23, 2003

(54) LOOK-AHEAD REFRESH FOR AN INTEGRATED CIRCUIT MEMORY

(75) Inventors: Oscar Frederick Jones, Jr., Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/074,375

(22) Filed: Feb. 11, 2002

(65) Prior Publication Data

US 2003/0161207 A1 Aug. 28, 2003

(51) Int. Cl.⁷ .............................................. G11C 13/00
(52) U.S. Cl. ........................ 365/222; 365/233; 365/236; 365/185.25
(58) Field of Search ....................... 365/185.01, 185.25, 365/222, 233, 236

(56) References Cited

U.S. PATENT DOCUMENTS

| | | | | |
|---|---|---|---|---|
| 4,344,157 A | * | 8/1982 | White et al. | 365/222 |
| 5,321,661 A | * | 6/1994 | Iwakiri et al. | 365/222 |
| 6,134,167 A | * | 10/2000 | Atkinson | 365/222 |
| 6,167,484 A | * | 12/2000 | Boyer et al. | 711/106 |
| 6,404,689 B1 | * | 6/2002 | Kirihata et al. | 365/222 |
| 6,411,157 B1 | * | 6/2002 | Hsu et al. | 327/536 |

* cited by examiner

*Primary Examiner*—Viet Q. Nguyen
(74) *Attorney, Agent, or Firm*—Peter J. Meza; William J. Kubida; Hogan & Hartson LLP

(57) ABSTRACT

A circuit and method for an integrated circuit memory incorporates a look-ahead function where refresh commands are presented to the device at least one cycle before actual internal refresh operations occur. Active cycles are executed on the same clock as the external command is applied. Active commands are unaltered and are executed on the same clock cycle as the occurrence of the active command. Active commands can be executed immediately without waiting to determine if the row address latch is to be sourced externally or internally.

16 Claims, 11 Drawing Sheets

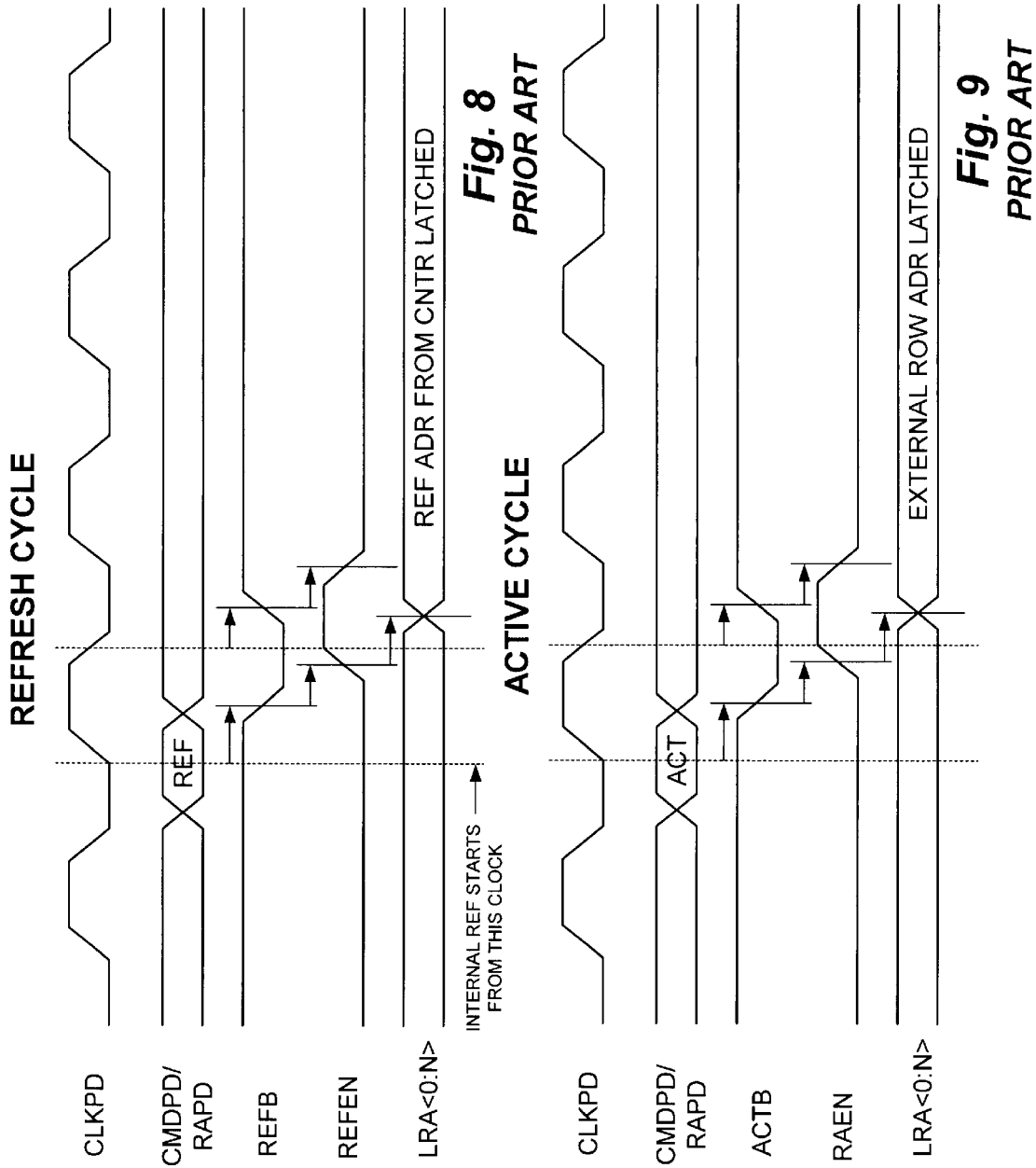

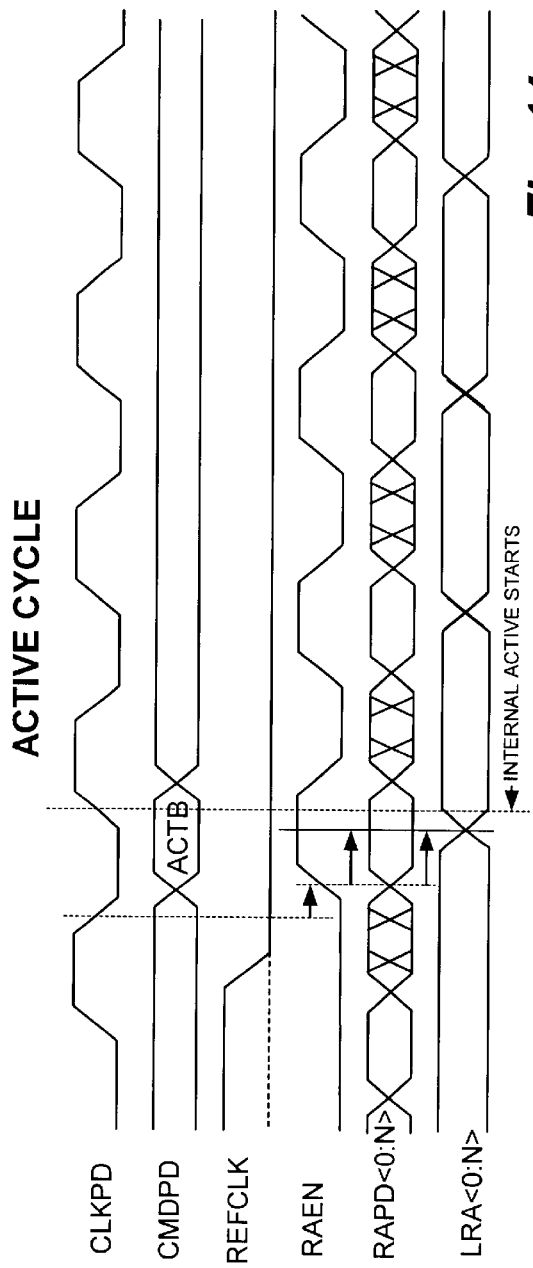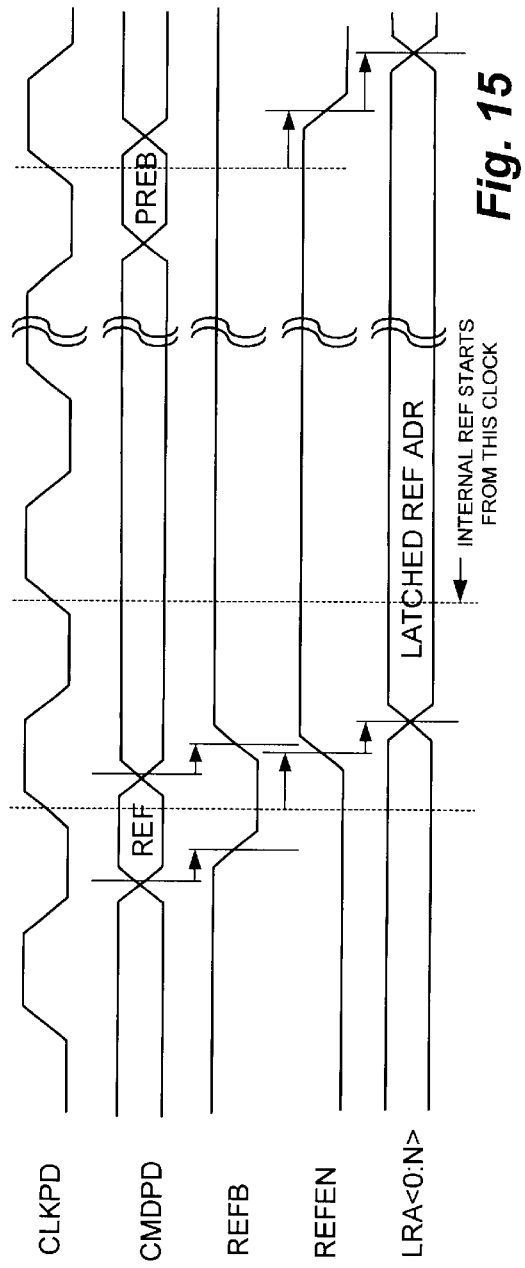

LOOK-AHEAD REFRESH FOR AN INTEGRATED CIRCUIT MEMORY

BACKGROUND OF THE INVENTION

This invention pertains to, integrated circuit memories, and, more particularly, to row access speed and the interaction with the refresh function in an integrated circuit memory.

A refresh or active command can occur on any clock cycle in an integrated circuit memory, requiring internal (on-chip) detection of the cycle type being executed. This detection process slows down the row address path within the device.

On-chip refresh circuitry has been incorporated in DRAM designs for several decades. When first introduced, a separated refresh pin was used to inform the DRAM to execute a refresh operation, using internally generated addresses, instead of a normal externally supplied row address. Later, /CAS-before-/RAS (CAS=column address strobe, and RAS=row address strobe) commands were used to enable on-chip refresh cycles. When /CAS was high and /RAS went low, a normal row selection was done using the external address supplied to the time when /RAS went low. However, if /CAS was low when /RAS went low, then a refresh operation was executed using an internally generated refresh address.

Today, SDRAMs support two different types of refresh: auto-refresh and self-refresh. Auto-refresh uses a specific command instruction: /CS (chip select), /RAS, and /CAS low with /WE (write enable) high, that is sampled at the rising edge of the DRAM's input clock signal. Self-refresh command is similar to auto-refresh, but occurs concurrently with entering power-down mode. In self-refresh, the device periodically executes refresh cycles (self-timed) to maintain stored data integrity during power-down mode.

In the past, incorporating on-chip refreshing using the methods described above, had little impact on device performance. However, as the operating frequency of DRAMs and SDRAMs has increased, the inclusion of on-chip refreshing, using conventional methods, has had an impact on row access performance. With present methods, during any cycle that an active command can be executed, a refresh command could have been executed instead, provided the device had been previously idle (in precharge state.) For this reason, the on-chip circuitry must hold-off row selection while the appropriate address is selected, depending on whether the present instruction is an active or a refresh command. This process is complicated in most instances. A command address latch is used to hold either the externally supplied row address or the internally generated address from the refresh address counter depending on the command. As clock rate increases, the penalty due to selecting which address to use before row selection can be enabled will become a larger percentage of the row select time.

What is desired, therefore, is a circuit and method for enabling the refresh function in an integrated circuit DRAM without undesirably adding to row access time.

SUMMARY OF THE INVENTION

According to the present invention, a circuit and method for an integrated circuit memory overcomes the deficiency of having to delay enabling the row selection circuitry until the appropriate address source has been determined, based on each cycle command. The circuit and method of the present invention incorporates a look-ahead approach where refresh commands are presented to the device one clock cycle before actual internal initiation of refresh operations occur. Active commands are unaltered and are executed on the same clock cycle as the occurrence of the active command. In this way, active commands can be executed immediately without the need of waiting to determine if the row address latch is to be sourced externally or internally.

The present invention uses a look-ahead for the REFRESH command in the memory. The invention reduces Active cycle latency (time from ACTIVE command to when the selected row and sense amplifiers have been activated) while not impacting system cycle time, even though a new look-ahead refresh method is used. On any given clock cycle when an ACTIVE command is given, an address input is selected on the ACTIVE command clock cycle, without the need to wait for control logic determination of whether it is an ACTIVE or a REFRESH command. Conversely, the refresh counter is selected on the command clock cycle that refresh initiates, without the need to wait for control logic to determine whether it is an ACTIVE or a REFRESH command since the condition was predetermined via the REFRESH command executed on the prior clock cycle.

The major advantage of the present invention is that it defines a separation between refresh and active commands such that the device can pre-select the row address path without waiting for a cycle type detection process. The detection of cycle type is done via a look-ahead (early) refresh command.

It is another advantage that the method of the present invention allows for on-chip refreshing without penalizing non-refresh command performance.

It is another advantage of the present invention that the timing examples shown apply not only to standard SDRAM memories, but the invention and timing diagrams apply to embedded DRAM and specialty DRAM as well.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIG. 8 is a timing diagram of a refresh cycle for the row address buffer circuit of FIGS. 3–5;

FIG. 9 is a timing diagram of an active cycle for the row address buffer circuit of FIGS. 3–5;

FIG. 14 is a timing diagram of a refresh cycle for the row address buffer circuit of FIG. 11; and FIG. 15 is a timing diagram of an active cycle for the row address buffer circuit of FIG. 11.

DETAILED DESCRIPTION

Figure 1:
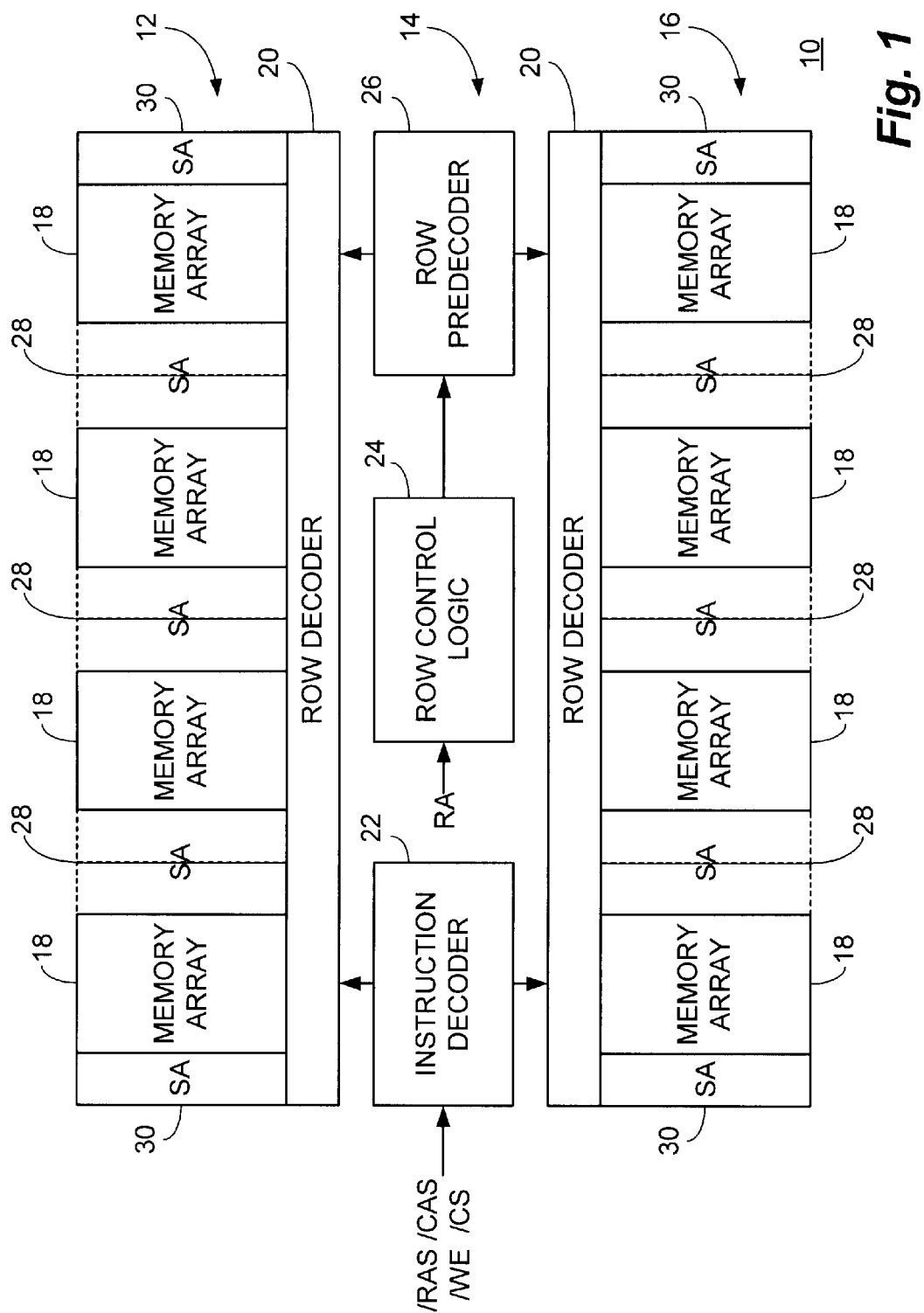
FIG. 1 is a highly simplified block diagram of a typical integrated circuit memory including two memory array portions, and associated row control circuitry including an instruction decoder, a row control logic block, and a row predecoder.

Referring now to FIG. 1, a highly simplified block diagram of a typical integrated circuit memory 10 such as a DRAM chip or an embedded memory includes two mirror-image memory array portions 12 and 16, and associated row control circuitry 14 including an instruction decoder 22 with /RAS, /CAS, /WE, and /CS inputs, a row control logic block 24 including an RA (row address) input, which is in turn coupled to a row predecoder 26. The outputs of the instruction decoder 22 and row predecoder 26 are coupled to array portions 12 and 16. The row predecoder 26 "pre-decodes" the externally applied address, which are in turn completely decoded by row decoders 20. Each memory array portion 12 and 16 includes a number of memory arrays 18 (four are shown in FIG. 1, but any number can be used as desired), and associated shared sense-amplifier blocks 28, and end sense-amplifier blocks 30. The memory 10 of FIG. 1 is only shown as a simplified typical example of an integrated circuit memory and therefore many typical functional blocks are not shown. Additionally, the architecture and layout of the memory can be changed if desired and still use the row address buffer circuit of the present invention, which is: described in further detail below.

Figure 2:
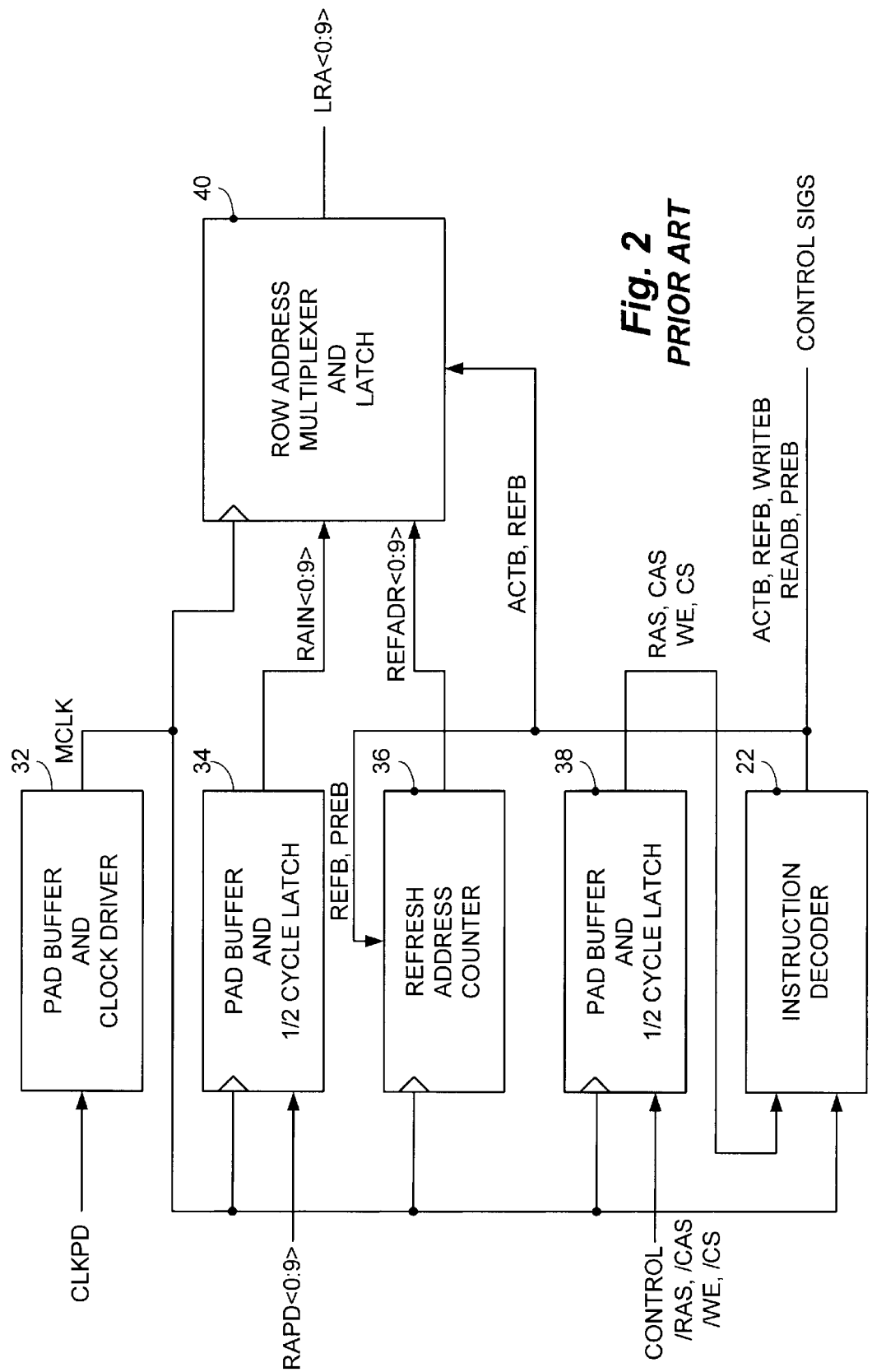
FIG. 2 is a block diagram showing further detail of the row control circuitry of the integrated circuit memory of FIG. 1.

Referring now to FIG. 2 a block diagram shows further detail of the row control circuitry of the integrated circuit memory 10 of FIG. 1. A Pad Buffer & Clock Driver block 32 receives the CLKPD (clock pad) signal and generates a MCLK (master clock) signal. A Pad Buffer & Half Cycle Latch block 34 receives the MCLK signal and the RAPD (row address pad inputs) signal and generates an RAIN (row address input) signal. A Refresh Address Counter block 36 receives the MCLK signal, as well as the REFB (complementary refresh command) and PREB (complementary precharge command) signals, and an output for generating a REFADR (refresh address) signal. A Pad Buffer & Half Cycle Latch block 38 receives the MCLK signal and a CONTROL signal including the /RAS, /CAS, /WE, and /CS signals and generates the RAS, CAS, WE, and CS signals. The instruction decoder 22 receives the RAS, CAS, WE, and CS signals and the MCLK signal, and generates the REFB, PREB, ACTB (complementary active command), and WRITEB (complementary write command), READB (complementary read command) control signals. The ROW ADDRESS MUX & LATCH block 40 receives the MCLK, RAIN, REFADR, ACTB, and REFB signals and generates the LRA (latched row address) signal. Often, the address multixplexer includes a burst counter for sequential burst accesses. The burst counter is not shown in FIG. 2 in order to simplify the diagram.

Figure 3:
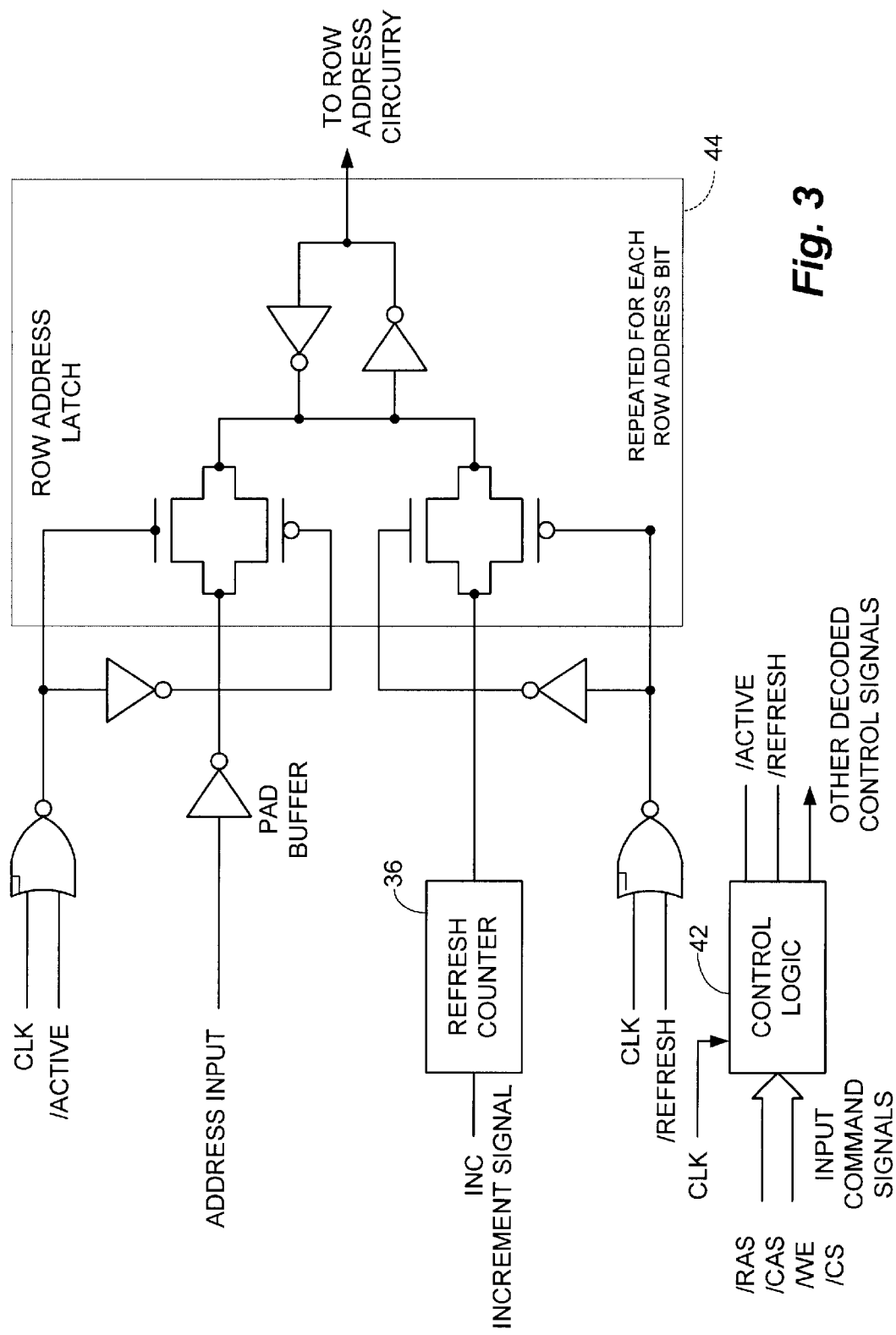
FIGS. 3–5 are circuit diagrams of known row address buffer circuits that form a portion of the row control circuitry of the integrated circuit memory of FIG. 1.
Figure 4:
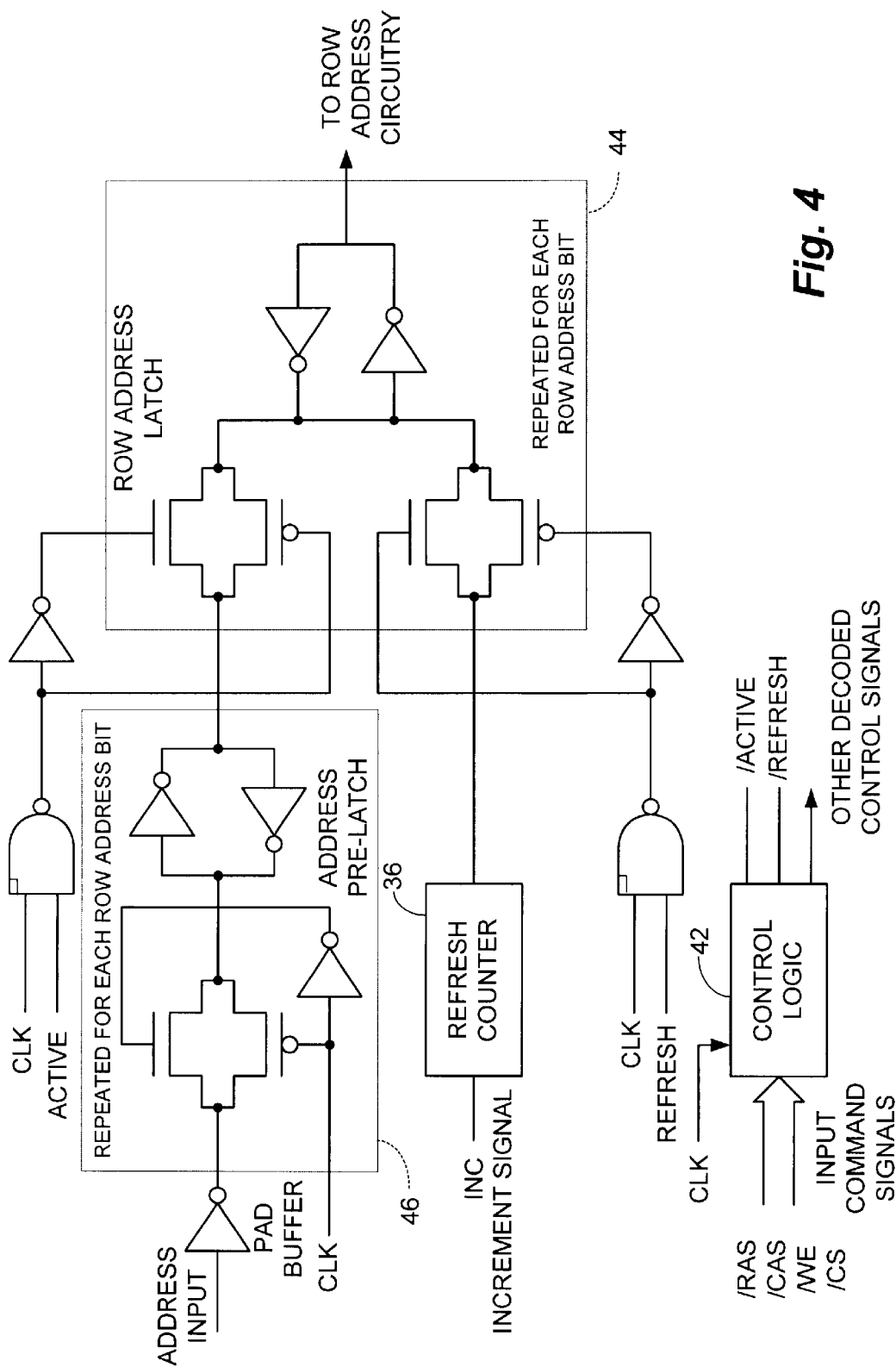
Figure 5:
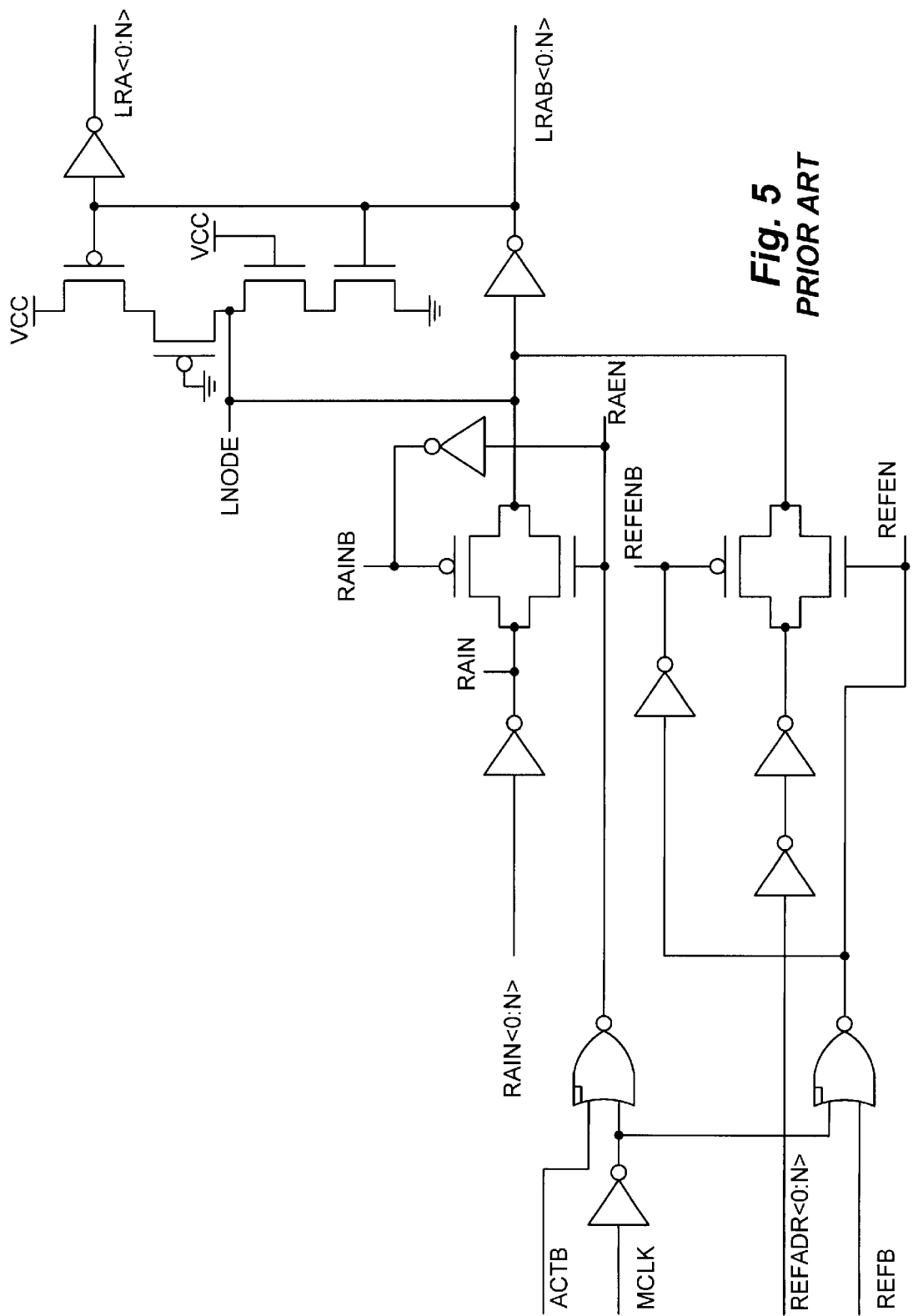

Referring generally to FIGS. 3–5 three circuit diagrams of known row address multiplexer circuits are shown that form a portion of the row control circuitry of the integrated circuit memory 10 of FIG. 1.

FIG. 3 illustrates a common circuit and method for selecting the source to be used for a row address within a DRAM memory. The refresh counter 36 is selected when a REFRESH command has been executed and the external address is selected when an ACTIVE command has been executed. Prior art allowed either a REFRESH command or an ACTIVE command to occur on the same clock cycle. When this is done, the on-chip control logic block 42 must determine what type of a command was issued. If the command was an ACTIVE command, the control logic 42 activates a signal, shown in FIG. 3 as "/ACTIVE", which selects the external address path as the input signal for the Row Address Latch block 44. If the command was a REFRESH command, the control logic activates a signal, shown in FIG. 3 as "/REFRESH", which selects the on-chip Refresh Counter 36 as the input signal for the Row Address Latch 44. It takes time for the Control Logic 42 to determine which type of command has been issued which delays the selection of the input source for the Row Address Latch 44. In the past, this has not been a major performance inhibitor. However, as the performance demands increase, this delay becomes more significant and it becomes necessary to find a selection method that does not slow the row address path for either an active command or for a refresh command.

The row address latch 44 includes a first switch including coupled transistors M6 and M8, and inverter U4. The gates of transistors M6 and M8 are controlled by the CLK and /ACTIVE signals, gated through logic gate U2. The signal input to the switch is provided by the ADDRESS INPUT through the pad buffer U1. A second switch includes coupled transistors M7 and M9, and inverter U5. The gates of transistors M6 and M8 are controlled by the CLK and /REFRESH signals, gated through logic gate U3. The signal input to the switch is provided by the output of the refresh counter 36. The output of the two switches are latched by the latch circuit including coupled inverters U10 and U11. The output of the latch is coupled to the row address circuitry.

If the control logic 42 takes a long time to select the correct cycle operation (ACTIVE or REFRESH) relative to the setup and hold time of the ADDRESS INPUT signal, then it may be necessary to add an Address Pre-Latch 46, as shown in FIG. 4. Pre-Latch 46 includes a clocked switch including coupled transistors M12 and M13, and inverter U14 for receiving a CLK signal. The latch portion includes cross-coupled inverters U15 and U16. The addition of the Pre-Latch 46 is likely to further undesirably impact performance. With the additional Pre-Latch 46, the combination of the Pre-Latch 46 and the Row Address Latch 44 becomes a full-cycle latch. This prevents the Row Addresses to "ripple-through" further in the Row Address path.

Referring now to FIG. 5, a more detailed version of the row address buffer and latch circuit is shown, including a latch circuit including P-channel transistors M3 and M4, N-channel transistors M5 and M6, and inverters U12 and U3 for generating a latched row address signal LRA and a complementary latched row address signal LRAB.

Figure 6:
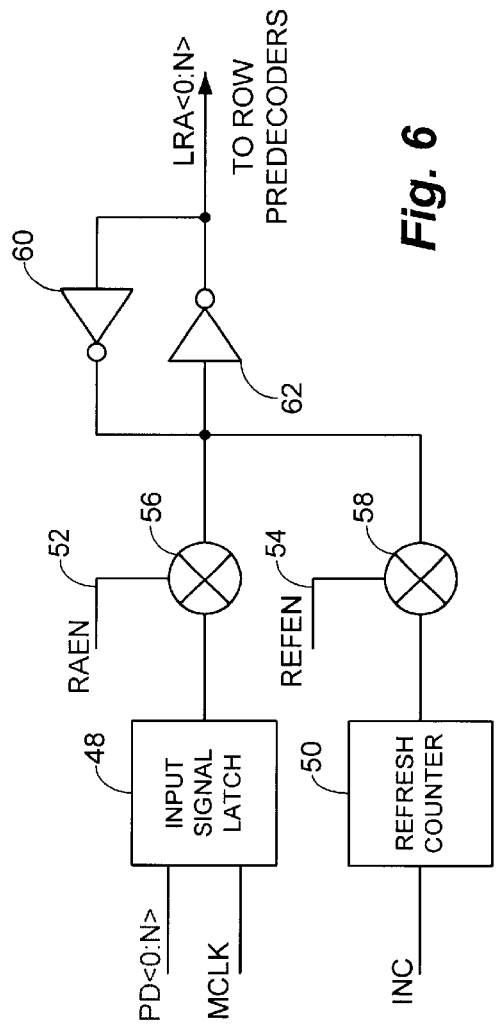
FIG. 6 is a simplified schematic diagram showing the essentially functionality of the row address buffer circuits shown in FIGS. 3–5.

Referring now to FIG. 6, a simplified schematic diagram showing the essentially functionality of the row address buffer circuits shown in FIGS. 3–5. In a first signal path, an input signal latch 48 provides a signal to the transmission gate 56 which is controlled by the RAEN row enable signal at node 52. In a second signal path, a refresh counter 50 provides a signal to the transmission gate 58 which is separately and independently controlled by the REFEN refresh enable signal at node 54. The outputs of transmission gates 56 and 58 are coupled together and latched by the cross-coupled inverters 60 and 62. The latch output is then delivered to additional row control circuitry, specifically the row predecoders.

Figure 7:
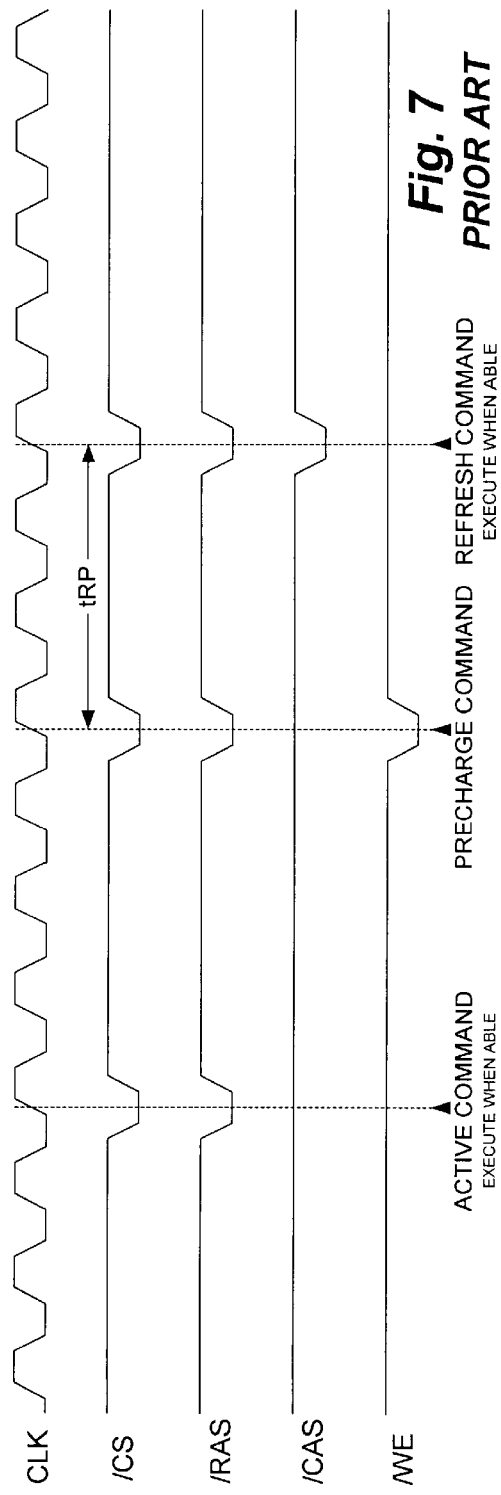
FIG. 7 is a simplified timing diagram associated with the operation of the row address buffer circuits of FIGS. 3–5.

Referring now to FIG. 7 a simplified timing diagram associated with the active and refresh operation of the row address buffer circuits of FIGS. 3–5 is shown. The enabling of the row selection circuitry must be delayed until the source (external address) can be determined. The READ and WRITE commands are omitted in FIG. 7 to simplify the diagram. The PRECHARGE command precharges the selected row and bank in the memory array. Similarly, enabling of the row selection circuitry must be again delayed until the source (internal address from the refresh counter) can be determined.

Referring now to FIG. 8, a timing diagram of a refresh cycle for the row address buffer circuits of FIGS. 3–5 is shown. The CLKPD (clock pad), CMDPD/RAPD (command pad/row address pad), REFB, REFEN, and LRA signals are shown. It should be noted that LRA(O:N) are not valid until the refresh command, REF, has been decoded. This results in the REFEN signal going active in order to selecte the refresh counter address (REFADR) path through the multiplexer in the row address latch circuit. Similarly, FIG. 9 shows a timing diagram of an active cycle for the row address buffer circuit of FIGS. 3-5. The CLKPD, CMDPD/RAPD, REFB, REFEN, and LRA signals are shown. It should be noted that LRA(O:N) are not valid until the active command, ACT, has been decoded. This results in the RAEN signal going active in order to select the external address path through the multiplexer in the row address latch circuit.

Figure 10:
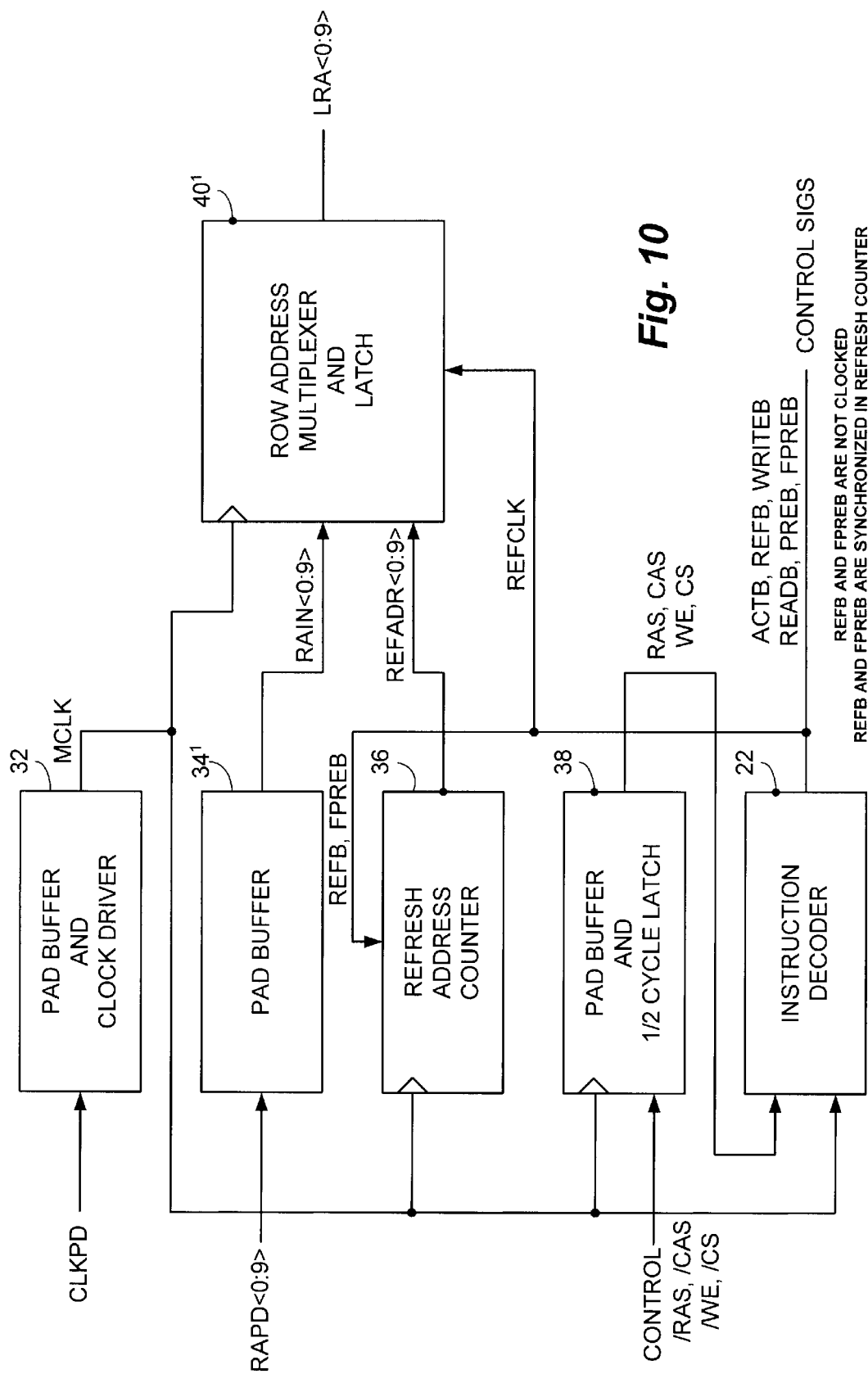
FIG. 10 is a block diagram according to the present invention showing further detail of the row control circuitry of the integrated circuit memory of FIG. 1.

Referring now to FIG. 10 a block diagram shows further detail of the row control circuitry of the integrated circuit memory 10 of FIG. 1 according to the present invention. While the overall structure of the row control circuitry is the same, the pad buffer circuit 34' does not include a latch circuit portion, and the row address mux and latch circuit 40' is modified according to the present invention as is described in further detail below.

Figure 11:
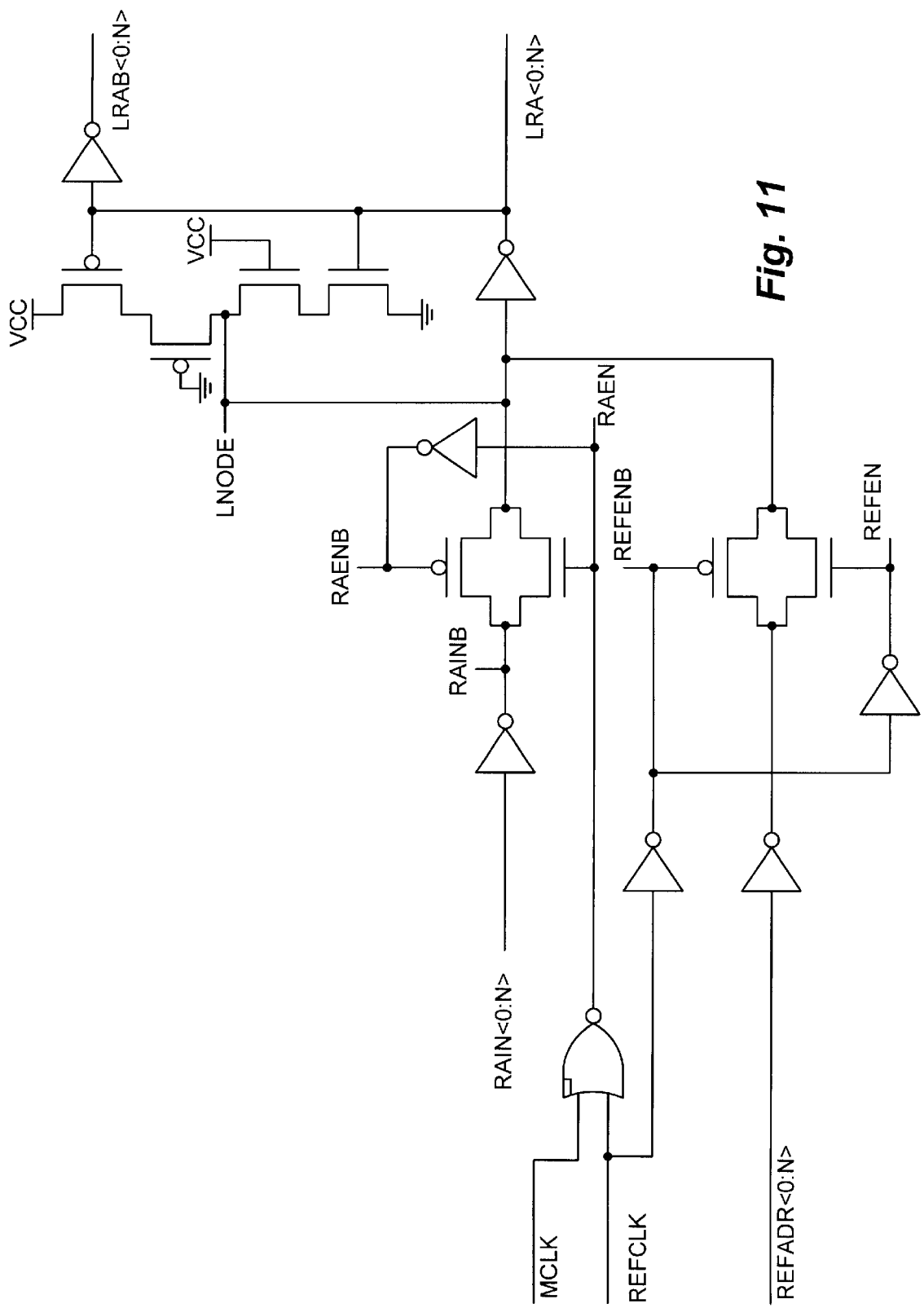
FIG. 11 is a circuit diagrams of a row address buffer circuit according to the present invention that forms a portion of the row control circuitry of the integrated circuit memory of FIG. 1.

Referring now to FIG. 11 a circuit diagram of the row address buffer and latch circuit is shown that form a portion of the row control circuitry of the integrated circuit memory 10 of FIG. 1, but modified according to the present invention. The latch portion includes P-channel transistors M3 and M4, N-channel transistors M5 and M6, and inverters U12 and U3 for generating a latched row address signal LRA and a complementary latched row address signal LRAB. A first transmission gate includes transistors M7 and M8, and inverter U8. The input of the transmission gate is coupled to the complementary RAIN (row address input) signal received via the output of inverter U10. The gate control nodes of transistors M7 and M8 are controlled by the RAEN and RAENB signals that are generated by NOR gate U9, which receives the master clock MCLK and refresh clock REFCLK signals. Similarly, a second transmission gate includes transistors M9 and M10, and inverter U7.

The input of the transmission gate is coupled to the complementary REFADR signal received via the output of inverter U4. The gate control nodes of transistors M7 and M8 are controlled by the REFEN and REFENB signals that are generated by inverter U5, which receives the refresh clock REFCLK signal.

It is important to note that in FIG. 11, while the two transmission gates M7/M8 and M9/M10 are respectively controlled by the RAEN and REFEN signals, both of these signals are derived from the REFCLK signal and are not independently generated signals as in the memory architecture discussed above with reference to FIGS. 3–5. The circuit described in FIG. 11 allows the externally generated addresses to ripple through to the row predecoders without the intervening delay of an additional clock cycle.

Figure 12:
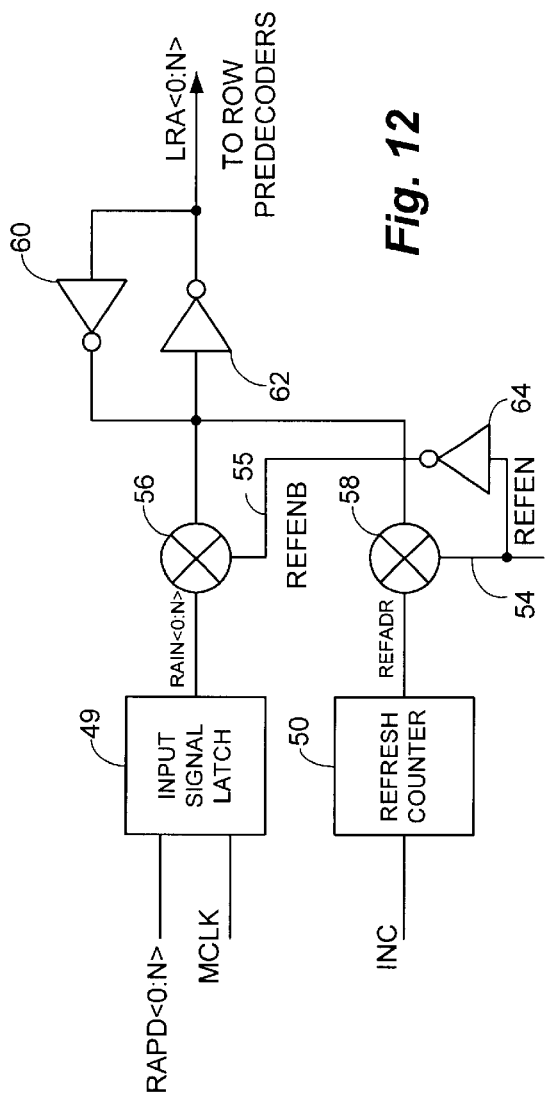
FIG. 12 is a simplified schematic diagram showing the essentially functionality of the row address buffer circuits shown in FIG. 11.

Referring now to FIG. 12, a simplified schematic diagram showing the essential functionality of the row address buffer circuit shown in FIG. 11. In a first signal path, an input signal buffer 49 provides a signal to the transmission gate 56. Transmission gate is controlled by the REFENB signal at node 55, which is the REFEN signal inverted through inverter 64. In a second signal path, the refresh counter 50 provides a signal to the transmission gate 58 which is also controlled by the REFEN refresh enable signal at node 54. The outputs of transmission gates 56 and 58 are coupled together and latched by the cross-coupled inverters 60 and 62. The latch output is then delivered to additional row control circuitry, specifically the row predecoders as before.

The main difference in the circuit of the present invention is that the external addresses are no longer latch in the first signal path, and the two transmission gates 56 and 58 are not separately controlled, but are both controlled with a look-ahead REFEN signal. In this way, the external addresses can be rippled through to the row predecoder if a REFENB signal is present at transmission gate 56.

Figure 13:
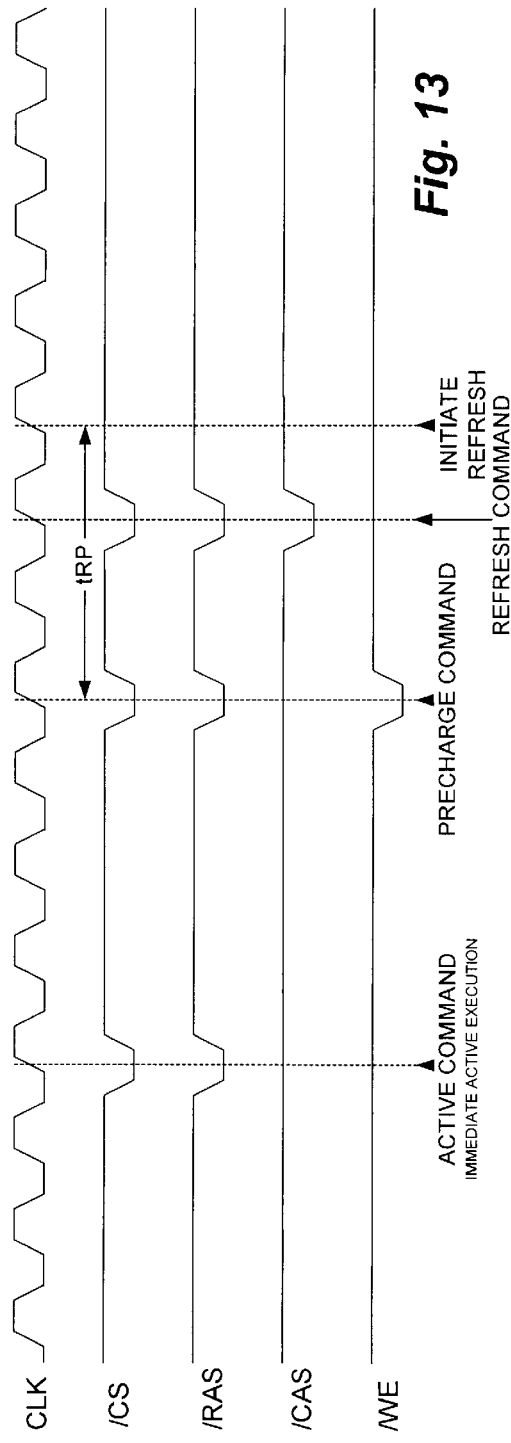
FIG. 13 is a simplified timing diagram associated with the operation of the row address buffer circuit of FIG. 11.

Referring now to FIG. 13 a simplified timing diagram associated with the active and refresh operation of the row address buffer circuits of FIG. 11 is shown. The row active command does not have to wait to determine the source of the row address. As before, the READ and WRITE commands have been omitted to simplify the timing diagram, and the PRECHARGE command precharges the selected row and bank in the memory array. The refresh command is delayed by one clock cycle. The refresh cycle can therefore start immediately after the clock because there is no need for waiting to determine the source of the address (internal or external).

Referring now to FIG. 14 a timing diagram of an active cycle for the row address buffer circuit of FIG. 11 is shown. The CLKPD, CMDPD, REFCLK, RAEN, RAPD, and LRA signals are shown. It should be noted in FIG. 14 that the latched row address signal LRA is immediately available after the rising edge of the RAEN signal without an additional wait to determine the source of the address.

Referring now to FIG. 15, a timing diagram of a refresh cycle for the row address buffer circuit of FIG. 11 is shown. The same memory address and control signals shown in the timing diagram of FIG. 14 are shown. It should be noted in FIG. 8 that from the start of the internal reference clock, the reference address from the internal refresh counter is available before the internal reference clock starts since a look-ahead REFEN signal is provided.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. For example, it is not necessary to wait for a command to occur in order to preemptively select the row address multiplexer. We therefore claim all modifications and variations coming within the spirit and scope of the following claims.

We claim:

1. A method for refreshing a DRAM memory comprising immediately selecting the internal refresh counter in response to an externally applied look-ahead refresh command in preparation for an on-chip refresh operation at least one clock cycle following the externally applied refresh command.

2. The method of claim 1 further comprising capturing an external row address in response to an externally applied active command if the look-ahead refresh command had not been applied on the previous clock cycle.

3. The method of claim 1 further comprising capturing an external row address in response to an externally applied active command if the look-ahead refresh command had not been applied on the previous Nth clock cycle, wherein N is an integer equal to or greater than one.

4. The method of claim 1 further comprising capturing an external row address on each clock cycle if the look-ahead refresh command has not been applied on the previous clock cycle.

5. The method of claim 1 further comprising capturing an external row address on each clock cycle if the look-ahead refresh command has not been applied on the previous Nth clock cycle, wherein N is an integer equal to or greater than one.

6. The method of claim 1 further comprising capturing an internal refresh address immediately after the externally applied refresh command, and the internal refresh address is latched at least one clock cycle after the external look-ahead refresh command is applied.

7. An integrated DRAM memory circuit comprising:
a DRAM memory array; and
means for immediately selecting the internal refresh counter in response to an externally applied look-ahead refresh command in preparation for an on-chip refresh operation in the DRAM memory array at least one clock cycle following the externally applied refresh command.

8. The circuit of claim 7 further comprising means for capturing an external row address in response to an externally applied active command if the look-ahead refresh command had not been applied on the previous clock cycle.

9. The circuit of claim 7 further comprising means for capturing an external row address in response to an externally applied active command if the look-ahead refresh command had not been applied on the previous Nth clock cycle, wherein N is an integer equal to or greater than one.

10. The circuit of claim 8 further comprising means for capturing an external row address on each clock cycle if the look-ahead refresh command has not been applied on the previous clock cycle.

11. The circuit of claim 7 further comprising means for capturing an external row address on each clock cycle if the look-ahead refresh command has not been applied on the previous Nth clock cycle, wherein N is an integer equal to or greater than one.

12. The circuit of claim 7 further comprising means for capturing an internal refresh address immediately after the externally applied refresh command, and the internal refresh address is latched at least one clock cycle after the external look-ahead refresh command is applied.

13. The circuit of claim 7 further comprising:
a first transmission gate having an input for receiving an external row address, a control terminal for receiving a refresh control signal, and an output;
a second transmission gate having an input for receiving an internal row address, a control terminal for receiving an inverted refresh control signal, and an output; and
a latch having an input coupled to the outputs of the first and second transmission gates, and an output for providing an output address signal
wherein the first transmission gate is enabled and the second transmission gate is disabled by the absence of an applied refresh control signal on a previous clock cycle, and wherein the first transmission gate is disabled and the second transmission gate is enabled by the presence of an applied refresh control signal on the previous clock cycle.

14. The circuit of claim 7 further comprising:
a first transmission gate having an input for receiving an external row address, a control terminal for receiving a refresh control signal, and an output;
a second transmission gate having an input for receiving an internal row address, a control terminal for receiving an inverted refresh control signal, and an output; and
a latch having an input coupled to the outputs of the first and second transmission gates,: and an output for providing an output address signal
wherein the first transmission gate is enabled and the second transmission gate is disabled by the absence of an applied refresh control signal on a previous Nth clock cycle, and wherein the first transmission gate is disabled and the second transmission gate is enabled by the presence of an applied refresh control signal on the previous Nth clock cycle, wherein N is an integer greater than or equal to one.

15. The circuit of claim 7 further comprising:
an input signal buffer having an input for receiving a first address, and an output;
a refresh counter having an output for providing a second address;
a first transmission gate having an input coupled to the output of the input signal buffer, a control terminal for receiving a refresh control signal, and an output;
a second transmission gate having an input coupled to the output of the refresh counter, a control terminal for receiving an inverted refresh control signal, and an output; and
a latch having an input coupled to the outputs of the first and second transmission gates, and an output for providing an output address signal.

16. A method for refreshing a DRAM memory comprising:
delaying the start of an on-chip refresh operation by at least one clock cycle with respect to an externally applied refresh command;
providing an at least one cycle look-ahead refresh command to a row address latch to predetermine the correct selection of the input of the row address latch; and
immediately clocking the row address latch without delay, if an active command is received.

* * * * *

UNITED STATES PATENT AND TRADEMARK OFFICE
CERTIFICATE OF CORRECTION

PATENT NO.    : 6,625,078 B2
DATED         : September 23, 2003
INVENTOR(S)   : Oscar Frederick Jones, Jr. and Kim C. Hardee It is certified that error appears in the above-identified patent and that said Letters Patent is hereby corrected as shown below:

Column 7,
Line 45, Claim 10, should depend from claim 7

Column 8,
Line 22, change ",:" to -- , --

Signed and Sealed this

Twentieth Day of January, 2004

JON W. DUDAS
*Acting Director of the United States Patent and Trademark Office*